March 22, 1960 N. E. EDWARDS ET AL 2,930,002

OSCILLATOR

Filed June 24, 1957

INVENTORS
NORMAN E. EDWARDS &
ANTHONY W. MUDIO
BY
Charles H. Brown
ATTORNEY 2,930,002

OSCILLATOR

Norman E. Edwards and Anthony W. Muoio, Haddonfield, N.J., assignors to Radio Corporation of America, a corporation of Delaware Application June 24, 1957, Serial No. 667,481

11 Claims. (Cl. 331—116)

The invention relates to improvements in transistor oscillators and particularly to a stabilized sine wave transistor oscillator.

The use of transistor circuits in the design of electronic equipment has resulted in certain advantages not realizable by using other circuits previously available. Savings in power consumption and a reduction in the size and weight of the equipment are possible. It is desirable that a transistor oscillator circuit be provided for use in such equipment which is simple in operation, compact in construction and characterized by a high degree of frequency stability.

It is an object of the invention to provide an improved stabilized transistor oscillator.

Another object is to provide an improved transistor oscillator in which the transistor is isolated from the frequency determining circuit of the oscillator so that the operating frequency is determined only by the frequency determining circuit and is not subject to change due to voltage variations or changes in transistor operating characteristics.

A further object is to provide an improved low output impedance sine wave transistor oscillator having a high degree of frequency stability and which is simple in operation and compact in construction.

According to the invention, a frequency determining circuit which may include either a crystal or an inductance-capacitance parallel tuned resonant circuit is coupled to the base electrode of a junction type transistor. A low output impedance is obtained by deriving the sine wave output from across a load element such as a resistor connected to the emitter electrode of the transistor. A feedback path including a resistor is completed from the emitter electrode to the frequency determining circuit. The internal base resistance of the transistor and the feedback resistor function to provide a feedback path which is not frequency sensitive. The feedback path is connected to the frequency determining circuit through a capacitor voltage divider circuit which may form a part of the frequency determining circuit. The capacitor voltage divider functions to dampen or swamp any change in the input internal capacitance of the transistor which might otherwies serve to detune the tuned resonant condition of the frequency determining circuit. The transistor is effectively isolated from the frequency determining circuit, and only the desired frequency is passed from the frequency determining circuit to the base input circuit of the transistor. A transistor oscillator characterized by a high degree of frequency stability is provided.

A more detailed description of the invention will now be given in connection with the accompanying drawing in which.

Figure 1:
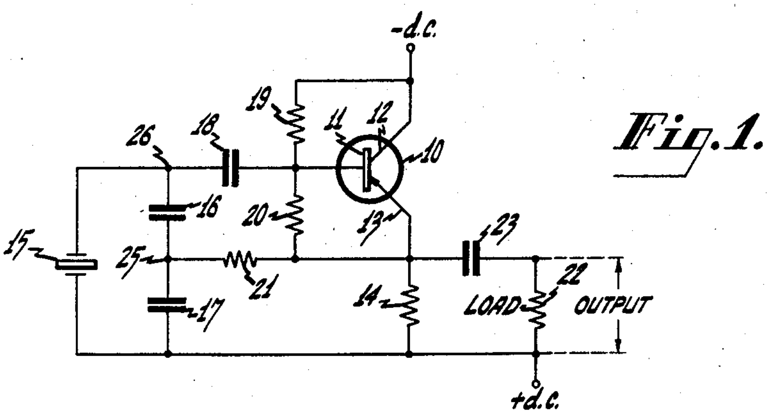
Figure 1 is a circuit diagram of a crystal controlled sine wave transistor oscillator constructed according to the invention.

Referring to Figure 1, there is shown a circuit diagram of a crystal controlled low frequency sine wave transistor oscillator constructed according to the invention and including a junction transistor 10. The transistor 10 will be described as a P–N–P junction transistor of N type conductivity. The transistor 10 includes a base electrode 11, collector electrode 12 and an emitter electrode 13. The collector electrode 12 is connected to the negative terminal of a source of D.C. (direct current) potential, and the emitter electrode 13 is connected to a positive terminal of the source of D.C. potential (a point of reference potential such as a ground return) through a load resistor 14.

A frequency determining circuit including a series resonant quartz crystal 15 having an operating frequency in the range of 20–20 kilocycles, for example, is coupled to the base electrode 11 over an electrical path including a direct current blocking capacitor 18. The capacitor 18 may be omitted in certain applications of the crystal oscillator, since the direct current flow in the coupling between the crystal 15 and the base electrode 11 will be negligible. A pair of capacitors 16, 17, preferably of the same value, are connected in series across the crystal 15 and form a capacitor voltage dividing circuit. A resistor 19 is connected between the collector electrode 12 and the base electrode 11, and a resistor 20 is connected between the base electrode 11 and the emitter electrode 13. The resistor voltage dividing network including resistors 19, 20 functions as a transistor temperautre stabilizing and biasing circuit.

According to the invention, a resistive feedback path including a resistor 21 is completed from the emitter electrode 13 to a tapping point 25 in the connection between the capacitors 16, 17. The point 25 is determined according to the value of the capacitors 16, 17 so that a feedback current fed to point 25 provides optimum excitation of the resonant or crystal circuit 15. The actual location of the point 25 may be determined by using conventional procedures. A utilization circuit or load represented by a resistor 22 is connected across the load resistor 14 through an output coupling capacitor 23.

Figure 2:
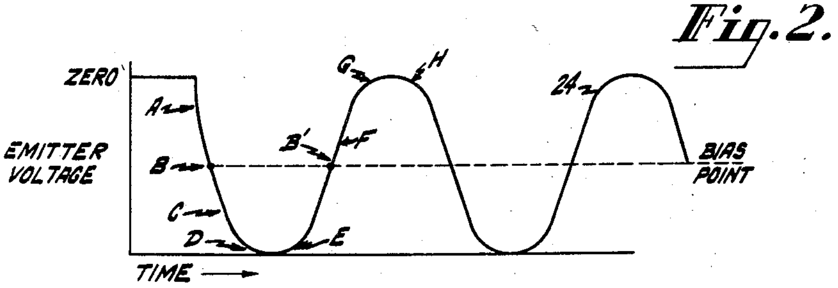
Figure 2 is a waveform useful in describing the operation of the invention.

Reference will be made to the waveform given in Figure 2 and indicated generally by the reference numeral 24 in describing the operation of the embodiment of the invention shown in Figure 1. For ease of description, various points on the waveform 24 will be referred to by capital letters. On start-up, a negative D.C. potential is applied to the collector electrode 12 of sufficient level to cause the transistor 10 to conduct. The emitter electrode 13 is biased positive with respect to the base electrode 11, while the collector electrode 12 is biased negative with respect to the base electrode 11. The emitter electrode 13 is said to be biased in the forward and/or current-conducting direction with respect to the base electrode 11, while the collector electrode 12 is biased in the reverse and/or nonconducting direction with respect to the base electrode 11.

The emitter electrode 13 goes negative, as shown by the section A of the waveform 24, and will continue to become more negative until the level or bias point B of the waveform 24 determined by the value of resistors 14, 19 and 20 is reached. In other words, the emitter electrode 13 will on start-up become negative going until the normal operating or working point B of the transistor 10 is established. This normal operating point B is determined by the bias supplied to transistor 10 according to the values of the resistors 14, 19 and 20.

A negative going current pulse is produced across the resistor 14 and is fed to the point 25 between the series-connected capacitors 16, 17 over an electrical path including the resistor 21. Capacitors 16, 17 are each charged in the proper direction to cause the shock excitation of the crystal 15 by the resulting current flow. The crystal 15 will resonate at the selected frequency thereof. A negative going input signal will appear at the point 26 in the output of the crystal circuit 15. The base electrode 11 is driven more negative, and the transistor 10 conducts more heavily. The emitter electrode 13 will become more negative, as indicated by the section C of the waveform 24. This action will continue until the point of transistor saturation is reached, point D of the waveform 24. Since the rate of current change at the emitter electrode 13 now becomes zero, the feedback through the resistor 21 also becomes zero. The resonant circuit or crystal 15 is free to oscillate at its natural rate. As the input signal appearing at point 26 starts to reverse in polarity, the base electrode 11 becomes more positive and the transistor 10 draws less current. As indicated at point E of the waveform 24, the emitter electrode 13 goes more positive toward the bias or normal working point B′ of the transistor 10.

As the emitter electrode 13 goes more positive, a positive going current pulse is derived from across the resistor 14 and is fed over the feedback path through resistor 21. The feedback pulse is in the correct phase to charge the capacitors 16, 17 in the proper direction to sustain the oscillations of the crystal 15. As the crystal 15 continues to oscillate at the resonate frequency thereof, the input signal appearing at point 26 continues to become more positive. The base electrode 11 becomes more positive, and the transistor 10 conducts less heavily. As shown in section F of the waveform 24, the emitter electrode 13 becomes more positive as the transistor 10 is driven toward cut off by the positive going voltage applied to the base electrode 11. This action continues until the transistor 10 is driven to cut off, point G of the waveform 24. Feedback through the resistor 21 becomes zero, since the rate of current change at the emitter electrode 13 is now zero. The crystal 15 is free to oscillate at its natural rate. The input signal appearing at point 26 reverses in polarity, and the base electrode 11 becomes more negative. The transistor 10 conducts, and the emitter electrode 13 goes more negative (from the point H of the waveform 24). A negative going feedback current pulse fed through the resistor 21 is in the proper phase to sustain the oscillations of the crystal 15, and so on.

The following circuit operations will occur in the manner described. The phase change at the emitter electrode 13 corresponds to the phase change in the resonant circuit of the crystal 15, and the oscillations of the crystal 15 at the given frequency thereof are sustained by the operation of the feedback path. A sine wave is produced in the low impedance emitter output circuit of the oscillator having a shape resembling that of the waveform 24 given in Figure 2. The sine wave output is supplied via the output circuit including capacitor 23 to a utilization circuit represented as the resistor 22.

A low output impedance since wave transistor oscillator including only one active circuit element, the transistor 10, is provided by the invention having a high degree of frequency stability. A feature is the use of a feedback path which is not frequency sensitive between the low impedance output circuit of the transistor 10 and the frequency determining circuit of the oscillator. The feedback path including the internal base resistance of the transistor 10 and resistor 21 is purely resistive in nature and does not include any frequency sensitive components. Capacitors 16, 17 function as a capacitor voltage divider in that any change in the level of the feedback is divided in constant proportion without respect to frequency. Since the feedback is derived from a low impedance source, the capacitors 16, 17 can be and are preferably of a large value in relation to the input capacitance of the transistor 10. Capacitors 16, 17 can be used which are of a sufficient value to effectively compensate by a swamping or damping action any reasonable change in the input impedance of the transistor 10. As will be described, the input impedance is normally high due to the emitter follower action and the resulting large effective value of resistor 20. The transistor 10 and the frequency determining circuit in the form of the crystal 15 are isolated from one another in that changes in the operating characteristics of the transistor 10 are not reflected as a change in the operating frequency of the frequency determining circuit. Only the desired operating frequency is passed by the series resonant crystal 15 to the base input circuit of the transistor 10.

In the biasing of the transistor 10, a relatively large load resistor 14 is used. The large resistor 14 provides a large voltage drop, making the transistor 10 a substantially constant current conducting device. The D.C. voltage divider including resistors 19, 20 functions to compare the fixed D.C. negative voltage applied to the collector electrode 12 and the voltage appearing at the emitter electrode 13. The bias voltage applied to the base electrode 11 from the source of D.C. negative potential over the direct current path including resistor 19 is varied as a function of the changes in the difference between the two voltages. Thus, as the emitter current rises due to a rise in the temperature of the junction transistor 10, a more positive bias is applied to the base electrode 11 and the transistor 10 conducts less heavily, and so on. Any change in the emitter current and voltage due to changes in the operating characteristics of the transistor 10 will result in a compensating change in the bias applied to the base electrode 11. Any excess base current is fed through the resistor 20 rather than through the transistor 10. The voltage dividing action of the resistors 19, 20 accomplishes temperature stabilization and biasing by adjusting the base current and voltage so as to maintain the transistor 10 at the proper operating point B, B′ thereof.

The resistor 20 is connected to the emitter electrode 13 rather than directly to the point of reference potential represented by the point of positive D.C. potential. The emitter follower action provides an effective multiplication of the value of the resistor 20, therefore, reducing the degree to which the resistor 20 shunts the crystal or resonant circuit 15.

A crystal controlled low frequency transistor oscillator arranged in the manner shown in Figure 1 and designed to function in the frequency range of 20–120 kilocycles has been constructed. A P–N–P junction transistor designated in the art as 2N270 was used for the transistor 10. The values of the various components were as follows:

| | |
|---|---|
| Resistor 14 | 6800 ohms. |
| Resistor 19 | 270,000 ohms. |
| Resistor 20 | 47,000 ohms. |
| Resistor 21 | 1,500 ohms. |
| Capacitors 18, 23 | .1 microfarad. |
| Capacitor 16 | 940 micromicrofarads for typical MT-cut crystal up to 75 kilocycles. 470 micromicrofarads for typical X-cut crystal above 75 kilocycles. |
| Capacitor 17 | 1470 micromicrofarads for typical MT-cut crystal up to 75 kilocycles. 470 micromicrofarads for typical X-cut crystal above 75 kilocycles. |

A negative 15 volt D.C. potential was supplied to the collector electrode 12. The above values are given only by way of example and may be changed to meet the requirements of a particular application without departing from the spirit of the invention.

Since there are no resonant tank circuits required and there are no timing adjustments other than the choice of the crystal 15, the operating frequency is determined only by the crystal 15. Because of this fact and the use of a resistive feedback path which is not frequency sensitive, it requires only a simple change of the crystal 15 to alter the operating frequency of the oscillator. In using different crystals having frequencies in the range of 20–120 kilocycles, it was found that harmonic distortion varied only from about one-half percent at the low end of the frequency range to approximately three percent at the high end of the range. It was also found that if a high Q crystal resonant circuit were used for the frequency determining circuit, the intervals D–E and G–H during which the crystal is free to resonate at its natural rate became negligibly small.

A number of P–N–P junction transistors having similar but not identical characteristics were tried in the oscillator using a 40 kilocycle crystal 15. The substitution of the transistors resulted in less than one cycle-per-second change in frequency. No noticable change in frequency could be discovered upon varying the collector voltage between the operable limits of the transistors used. In considering the value of the resistor 21, the value of the resistor 21 could be varied between 270 and 5600 ohms and still maintain the operation of the oscillator. However, the most desirable operation occurred using a resistor 21 having a value between 820 and 3300 ohms. The frequency remained unaltered and the voltage output changed less than plus or minus 10% when the value of the resistor 21 was varied through the later range. The value of resistor 21 is chosen in a particular application so that sufficient feedback is provided to sustain the oscillations of the crystal circuit 15.

Figure 3:
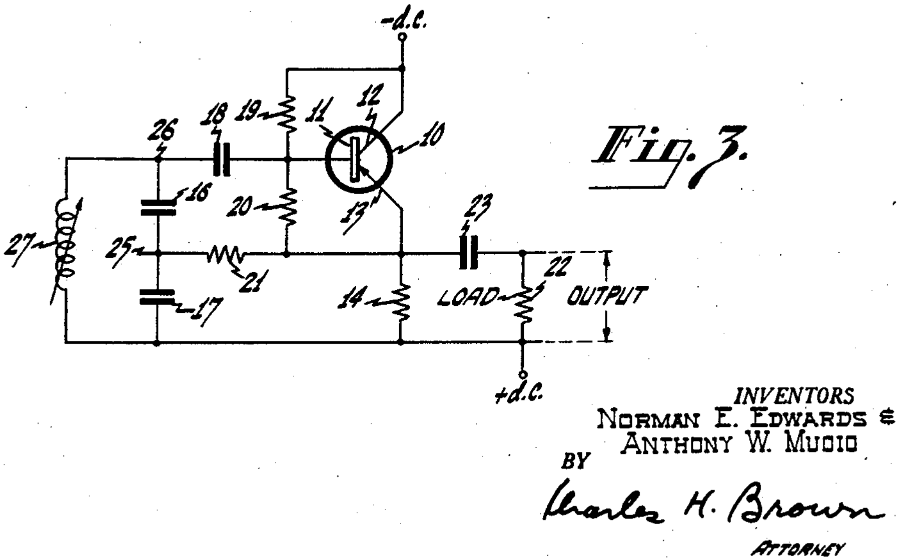
Figure 3 is a circuit diagram of a further embodiment of the invention.

While the invention has been described in connection with the crystal controlled embodiment shown in Figure 1, the invention is not limited thereto. Referring to Figure 3, a further embodiment of the invention is shown including an inductance-capacitance tuned resonant frequency determining circuit. The operation of the embodiment shown in Figure 3 is the same as given above. Components in the arrangement of Figure 3 corresponding to the components in the arrangement of Figure 1 have been given the same reference numerals. The inductor 27 is connected across the series-connected capacitors 16, 17 to form a parallel tuned resonant circuit. The inductor 27 may be made variable to provide a frequency band through which the oscillator can be selectively tuned, and a trimmer capacitor, not shown, may be connected across the inductor 27 to provide fine tuning in a manner understood in the art. In the operation of the arrangement shown in Figure 3, the low end of the frequency band used is determined by the resistance of the resonant circuit including the inductor 27 and capacitors 16, 17. The high end of the frequency band used is determined by the operating characteristics of the transistor 10. By the use of the resistive feedback path and the voltage dividing network including capacitors 16, 17, a frequency stabilized sine wave transistor oscillator is provided.

While reference has been made to the use of a particular type of P–N–P junction transistor, the invention is not limited to the user thereof. Various other types of P–N–P junction transistors may be used. Further, the invention may be readily adapted for use with N–P–N junction transistors of P type conductivity by merely altering the electrode connections and the polarity of the voltages supplied thereto in a known manner.

A transistor oscillator is provided according to the invention which differs in several respects from oscillators previously known. By deriving the output from across the load resistor 14 in the emitter circuit 13 of the transistor 10, a low output impedance is provided, facilitating the connection of the oscillator to the input circuit of any one of many different types of utilization circuits. In conventional oscillator circuits such as the type defined as Colpitts oscillators, the feedback path is, in effect, a short circuit connection in which the resistance is equal to zero. If such a feedback path were provided in the invention, the transistor oscillator of the invention would not work. Point 25 would be connected to the low impedance emitter circuit 13, thereby effectively shorting out capacitor 17 and excessively damping the oscillations of the frequency determining circuit. By the arrangement of the invention, a low output impedance transistor oscillator having a high degree of frequency stability is obtained.

What is claimed is:

1. An oscillator comprising a transistor device having an emitter electrode, base electrode and collector electrode, a frequency determining circuit including a pair of series-connected capacitors connected between said base electrode and a point of reference potential, a source of unidirectional potential, means for connecting said collector electrode to said source, an output load resistor, means for connecting said emitter electrode through said load resistor to said point of reference potential, a second resistor connected between said collector electrode and said base electrode and a third resistor connected between said base electrode and the junction of said emitter electrode and said load resistor, a fourth resistor, and a feedback path including said fourth resistor connected between said junction and a tapping point in the connection between said pair of capacitors.

2. An oscillator as claimed in claim 1 and wherein said frequency determining circuit includes a series resonant crystal of given frequency to form a parallel tuned resonant circuit connected across said pair of capacitors.

3. An oscillator as claimed in claim 1 and wherein said frequency determining circuit includes an inductor connected across said pair of capacitors to form a parallel tuned resonant circuit.

4. A sine wave oscillator comprising a junction transistor having a base electrode, emitter electrode and collector electrode, a direct current blocking capacitor having one side thereof connected to said base electrode, a frequency determining circuit including a pair of series-connected capacitors connected between the other side of said blocking capacitor and a point of reference potential, means to connect said collector electrode to a source of unidirectional potential, a load resistor, means to connect said emitter electrode through said load resistor to said point of reference potential, a second resistor connected between said collector electrode and said base electrode and a third resistor connected between said base electrode and the junction of said emitter electrode and said load resistor, a fourth resistor, a feedback path including said fourth resistor connected between said last-mentioned junction and a tapping point in the connection between said pair of capacitors, an output coupling capacitor, and an output circuit including said coupling capacitor connected across said load resistor.

5. A sine wave oscillator as claimed in claim 4 and wherein said frequency determining circuit includes a series resonant crystal of given frequency connected across said pair of capacitors, said base electrode being connected through said blocking capacitor to a tapping point in the connection between said crystal and one of said pair of capacitors, a tapping point in the connection between said crystal and the other of said pair of capacitors being connected to said point of reference potential.

6. A sine wave oscillator comprising, a P–N–P junction transistor of N type conductivity having a base electrode, emitter electrode and collector electrode, a source of negative unidirectional potential, means for connecting said collector electrode to said source, a frequency determining circuit including a pair of series-connected capacitors, said series-connected capacitors being connected between said base electrode and a point of reference potential, an output load resistor, means for connecting said emitter electrode through said load resistor to said point of reference potential, a second resistor connected between said collector electrode and said base electrode and a third resistor connected between said base electrode and the junction of said emitter electrode and said load resistor, a fourth resistor, and a feedback path including said fourth resistor connected between said junction and a tapping point in the connection between said pair of capacitors.

7. A sine wave oscillator comprising, a P–N–P junction transistor of N type conductivity having a base electrode, emitter electrode and collector electrode, a source of negative unidirectional potential, means for connecting said collector electrode to said source, a direct current blocking capacitor, a frequency determining circuit including a pair of series-connected capacitors and a series resonant crystal of given frequency connected across said pair of capacitors, means for connecting a tapping point in the connection between said crystal and one of said pair of capacitors through said blocking capacitor to said base electrode, means for connecting a tapping point in the connection between said crystal and the other of said pair of capacitors to a point of reference potential, a load resistor, means for connecting said emitter electrode through said load resistor to said point of reference potential, a second resistor connected between said collector electrode and said base electrode and a third resistor connected between said base electrode and the junction of said emitter electrode and said load resistor, a fourth resistor, a feedback path including said fourth resistor connected between said junction and a tapping point in the connection between said pair of capacitors, an output coupling capacitor, and an output circuit including said coupling capacitor connected across said load resistor.

8. A sine wave oscillator comprising, a P–N–P junction transistor of N type conductivity having a base electrode, emitter electrode and collector electrode, a source of negative undirectional potential, means for connecting said collector electrode to said source, a direct current blocking capacitor, a frequency determining circuit including a pair of series-connected capacitors and an inductor connected across said pair of capacitors, means for connecting a tapping point in the connection between said inductor and one of said pair of capacitors through said blocking capacitor to said base electrode, means for connecting a tapping point in the connection between said inductor and the other of said pair of capacitors to a point of reference potential, a load resistor, means for connecting said emitter electrode through said load resistor to said point of reference potential, a second resistor connected between said collector electrode and said base electrode and a third resistor connected between said base electrode and the junction of said emitter electrode and said load resistor, a fourth resistor, a feedback path including said fourth resistor connected between said junction and a tapping point in the connection between said pair of capacitors, an output coupling capacitor, and an output circuit including said coupling capacitor connected across said load resistor.

9. An oscillator comprising, in combination, a current conducting device having a first, second, and third electrode, a source of unidirectional potential, means for connecting said first electrode to said source, a frequency determining circuit including a pair of series-connected capacitors, means for connecting said series-connected capacitors between said second electrode and a point of reference potential, an output load resistor, means for connecting said third electrode through said load resistor to said point of reference potential, a second resistor connected between said first and said second electrodes and a third resistor connected between said second electrode and the junction of said third electrode and said load resistor, a fourth resistor, and a feedback path including said fourth resistor connected between said junction and a tapping point in the connection between said pair of capacitors.

10. An oscillator comprising, in combination, a frequency determining circuit including a capacitor voltage divider, a transistor having first, second and third electrodes, a connection from said first electrode to one end of said frequency determining circuit, a source of unidirectional potential having a terminal of one polarity connected to said second electrode and a terminal of opposite polarity connected to the other end of said frequency determining circuit, a resistor connecting the electrical center of said capacitor voltage divider to said third electrode, other resistors respectively connecting said second and third electrodes to said first electrode, and still another resistor connecting said third electrode to said terminal of opposite polarity.

11. An oscillator as claimed in claim 10 and wherein said first, second and third electrodes are base, collector and emitter electrodes respectively.

References Cited in the file of this patent

"Symposium on the Application of Transistors to Military Electronics Equipment," held September 2–3, 1953, received by Patent Office Library September 13, 1957, pages 263–277.

"Transistor Circuit Handbook," pub. by Coyne Electrical School, Chicago, Ill.; August 1, 1956, pages 84–86.

"Transistor Circuit Applications," pages 171–173 of "Electronics" for August 1953.

"Stable Transistor Oscillator," by Keonjian, pp. 672–674; of Electrical Engineering for August 1955, page 85 of "Transistor Circuit Handbook," by Garner, copyright 1956, pub. by Coyne Electrical School, Chicago 12, Ill.